US005531015A

United States Patent [19]

Manlief et al.

[11] Patent Number: 5,531,015

[45] Date of Patent: Jul. 2, 1996

[54] METHOD OF MAKING SUPERCONDUCTING WIND-AND-REACT COILS

[75] Inventors: Michael D. Manlief, Westborough; Gilbert N. Riley, Jr., Marlborough; John Voccio, Somerville; Anthony J. Rodenbush, Marlborough, all of Mass.

[73] Assignee: American Superconductor Corporation, Westborough, Mass.

[21] Appl. No.: 188,220

[22] Filed: Jan. 28, 1994

[51] Int. Cl.$^6$ .................................................. H01L 39/24

[52] U.S. Cl. ........................ 29/599; 174/125.1; 505/211; 505/700; 505/704; 505/705

[58] Field of Search .......................... 174/125.1; 29/599; 505/211, 700, 704, 705

[56] References Cited

U.S. PATENT DOCUMENTS

| | | | |
|---|---|---|---|
| 4,885,273 | 12/1989 | Sugimoto et al. . | |
| 4,965,245 | 10/1990 | Sugimoto et al. | 174/125.1 X |
| 5,063,200 | 11/1991 | Okada et al. | 505/1 |
| 5,068,219 | 11/1991 | Hagino et al. | 29/599 X |
| 5,081,075 | 1/1992 | Jin et al. | 29/599 X |
| 5,106,825 | 4/1992 | Mandigo et al. | 505/1 |
| 5,110,789 | 5/1992 | Yamaguchi et al. | 29/599 X |
| 5,140,006 | 8/1992 | Woolf | 505/1 |
| 5,187,859 | 2/1993 | Heim | 29/599 |
| 5,231,366 | 7/1993 | Haramaki et al. | 29/599 X |
| 5,312,802 | 5/1994 | Hayashi et al. | 174/125.1 X |
| 5,330,969 | 7/1994 | Finnemore et al. | 505/431 |

FOREIGN PATENT DOCUMENTS

| | | |
|---|---|---|
| 1-012413 | 1/1989 | Japan . |
| 1-241708 | 9/1989 | Japan . |
| 1-241713 | 9/1989 | Japan . |

OTHER PUBLICATIONS

Ekin et al., "Effect of axial strain on the critical current of Ag–sheathed Bi–based superconductors in magnetic fields up to 25 T", Applied Physics Letters 61, 858–860, 1992.

Luo et al., "Thermostability and decomposition of the (Bi, Pb)$_2$Sr$_2$Ca$_2$Cu$_3$O$_{10}$ phase in silver–clad tapes", J. Appl. Phys. 72, 2385–2389, 1992.

Riley et al., "Ceramic Superconductor Composite Wires", American Ceramic Society Bulletin 72, 91–97, 1993.

Sato et al., "High–Jc Silver–Sheathed Bi–Based Superconducting Wires", IEEE Transactions on Magnetics 27, 1231–1238, 1991.

Tenbrink et al., "Recent Results on Test Winding and Coils Using B1–2212/Ag HTSC Wires", paper CY–2, ICMC '93, 1993.

*Primary Examiner*—Carl J. Arbes
*Attorney, Agent, or Firm*—Fish & Richardson

[57] ABSTRACT

A process for manufacturing superconducting magnetic coils from strain-tolerant, superconducting multi-filament composite conductors is described. The method involves winding the precursor to a multi-filament composite conductor and an insulating material or its precursor around a mandrel in order to form a coil, and then exposing the coil to high temperatures and an oxidizing environment. The insulating material or its precursor is chosen to permit exposure of the superconductor precursor filaments to the oxidizing environment, and to encase the matrix-forming material enclosing the filaments, which is reversibly weakened during processing.

21 Claims, 7 Drawing Sheets

METHOD OF MAKING SUPERCONDUCTING WIND-AND-REACT COILS

The invention relates generally to superconducting magnetic coils and methods for manufacturing them. In particular, the invention relates to a wind-and-react process used to produce mechanically robust, high temperature superconducting coils which have high winding densities and are capable of generating large magnetic fields.

BACKGROUND OF THE INVENTION

The wind-and-react method involves winding the precursor to a superconducting material around a mandrel in order to form a coil, and then processing the coil with high temperatures and an oxidizing environment. The processing method results in the conversion of the precursor material to a desired superconducting material, and in the healing of micro-cracks formed in the precursor during the winding process, thus optimizing the electrical properties of the coil.

Superconducting magnetic coils, like most magnetic coils, are formed by wrapping an insulated conducting material around a mandrel defining the shape of the coil. When the temperature of the coil is sufficiently low that the conductor can exist in a superconducting state, the current-carrying performance of the conductor is markedly increased and large magnetic fields can be generated by the coil.

Certain ceramic materials exhibit superconducting behavior at low temperatures, such as the compound $Bi_2Sr_2Ca_nCu_nO_{2n+4}$ where n can be either 1, 2, or 3. One material, $Bi_2Sr_2Ca_2Cu_3O_{10}$ (BSCCO (2223)), performs particularly well in device applications because superconductivity and corresponding high current densities are achieved at relatively high temperatures ($T_c$=115 K.). Other oxide superconductors include general Cu-O-based ceramic superconductors, such as members of the rare-earth-copper-oxide family (ie., YBCO), the thallium-barium-calcium-copper-oxide family (ie., TBCCO), the mercury-barium-calcium-copper-oxide barium-calcium-copper-oxide family (ie., HgBCCO), and BSCCO compounds containing lead (ie., $(Bi,Pb)_2Sr_2Ca_2Cu_3O_{10}$).

Insulating materials surrounding the conductor are used to prevent electrical short circuits within the winding of a coil. From a design point of view, the insulation layer must be able to withstand large electric fields (as high as $4\times10^5$ V/cm in some cases) without suffering dielectric breakdown, a phenomenon that leads to electrical cross-talk between neighboring conductors. At the same time insulation layers must be as thin as possible (typically less than 50–150 μm) so that the amount of superconducting material in the coil can be maximized.

Using existing conducting and insulating materials, the maximum magnetic field generated by a superconducting coil is ultimately determined by the winding density (defined as the percentage of the volume of the coil occupied by the conductor) and the coil geometry. However, the large tensional forces necessary for high winding densities can leave conductors in highly stressed and/or strained states. The bend strain of a conductor, equal to half the thickness of the conductor divided by the radius of the bend, is often used to quantify the amount of strain imposed on the conductor through coil formation. Many superconducting magnet applications involving high-density conductor windings require conductor bend strains on the order of 0.2%, and in some cases much higher. The critical strain of a conductor is defined as the amount of strain the material can support before experiencing a dramatic decrease in electrical performance. The critical strain value is highly dependent on the formation process used to fabricate the conductor, and is typically between 0.05%–1.0%, depending on the process used. If the bend strain exceeds the critical strain of a conductor, the current-carrying capability of the conductor, and hence the maximum magnetic field generated by a coil, will be decreased significantly.

One approach to manufacturing high-performance conductors having desirable mechanical properties involves starting with a precursor to a high temperature superconducting material, typically a ceramic oxide in a powder form. Despite relatively poor mechanical properties and more complex manufacturing processes which requires high temperatures and an oxidizing environment, high temperature superconducting materials are preferred to low temperature superconducting materials for certain applications because they operate at higher ambient temperatures. Oxide powders are packed into a silver tube (chosen because of malleability, inertness, and high electrical conductivity) which is then deformed and reduced in size using standard metallurgical techniques: extrusion, swaging, and drawing are used for axisymmetric reductions resulting in the formation of rods and wires, while rolling and pressing are used for aspected reductions resulting in the formation of tapes and sheets (Sandhage et al., "Critical Issues in the OPIT Processing of High-Ic BSCCO Superconductors", Journal of Metals 3, 21, 1991).

Following the deformation process, heating and cooling results in the growth and evolution of individual crystalline oxide superconductor grains in the conductor which typically take on a rectangular platelet shape. Further deformation results in a collective alignment of the crystallographic axes of the grains. An iterative heating/deforming schedule unique to the ceramic oxide forms of superconductors is typically carried out until the desired grain size, alignment, and density of the superconducting state are achieved.

Conductors having a single oxide core, classified as mono-filament composite conductors, result from the iterative schedule described above and can have critical strain values as high as 0.1%. Mono-filament composite conductors can be transformed into multi-filament composite conductors using a rebundling fabrication operation involving further reduction in size of the mono-filament composite conductors, and finally concatenation of individual conductors to form a single conductor. Typically, the evolution of cracks in response to bend strains is more likely in mono-filament composite conductors than in multi-filament composite conductors, where critical strain values increase with the number of filaments in the conductor, and can be greater than 1.0%. Other limitations of mono-filament composite conductors include decreases in crack healing ability and oxygen access to the conductor during processing. Furthermore, because mono-filament composite conductors have only a single superconducting region, it is difficult to control the conductor size and shape, and mechanically robust conductors can not be easily fabricated (K. Osamure, et al., Adv. Cryo. Eng., ICMC Supplemental, 38, 875, 1992). Thus, multi-filament composite conductors have desirable mechanical properties, and can be used in coils requiring high winding densities.

One method used to fabricate coils with multi- and mono-filament composite conductors is the react-and-wind process. This method first involves the formation of an insulated composite conductor which is then wound into a coil. In this method, a precursor to a composite conductor is fabricated and placed in a linear geometry, or wrapped loosely around a coil, and placed in a furnace for processing. The precursor can therefore be surrounded by an oxidizing environment during processing, which is necessary for conversion to the desired superconducting state. In the react-and-wind processing method, insulation can be applied after the composite conductor is processed, and materials issues such as the oxygen permeability and thermal decomposition of the insulating layer do not need to be addressed.

In the react-and-wind process, the coil-formation step can, however, result in straining composite conductors in excess of the critical strain value of the conducting filaments. Strain introduced to the conducting portion of the wire during the deformation process can result in micro-crack formation in the ceramic grains, severely degrading the electrical properties of the composite conductor.

Another method used to fabricate magnetic coils with mono-filament composite conductors is the wind-and-react method. In this method, the eventual conducting material is typically considered to be a "precursor" until after the final heat treating and oxidation step. Unlike the react-and-wind process, the wind-and-react method as applied to high temperature superconductors requires that the precursor be insulated before coil formation, and entails winding the coil immediately prior to a final heat treating and oxidation step in the fabrication process. This final step results in the repair of micro-cracks incurred during winding, and is used to optimize the superconducting properties of the conductor. However, these results are significantly more difficult to achieve for a coil geometry than for the individual wires which are heat treated and oxidized in the react-and-wind process.

Due to the mechanical properties of the conducting material, superconducting magnetic coils fabricated using the wind-and-react approach with mono-filamentary composite conductors have limitations related to winding density and current-carrying ability. Although the wind-and-react process may repair strain-induced damage to the superconducting material incurred during winding, the coils produced are not mechanically robust, and thermal strain resulting from cool down cycles can degrade the coil performance over time.

A feature of the invention is a wind-and-react process which is used to manufacture superconducting magnetic coils with multi-filament composite conductors. This processing method can be used to manufacture several variations of coils types, all of which are discussed below.

An advantage of the invention is ability to produce mechanically robust coils requiring high winding densities, without significantly degrading the superconducting properties of the multi-filament composite conductors used to form the coils.

SUMMARY OF THE INVENTION

The present invention relates to a wind-and-react processing method used to fabricate superconducting magnetic coils featuring strain-tolerant multi-filament composite conductors. This invention has various aspects which individually contribute improvement over previous react-and-wind coils, and wind-and-react coils made with mono-filament conductors. Specifically, materials and processing steps have been adapted in order to fabricate coils which allow adequate oxygen access to the precursor to the multi-filament composite conductor in order to affect conversion to the desired superconducting state, while at the same time allowing preservation of the materials and geometrical tolerances of the coil. Superconducting coils requiring high-density complex winding geometries can often only be fabricated with multi-filament composite conductors because mono-filament conductors are intrinsically less flexible and their electrical properties are more difficult to rehabilitate.

In one aspect, the invention relates to a method for producing a superconducting magnetic coil featuring the following steps: fabricating a precursor to a multi-filament composite conductor from multiple high-temperature superconducting filaments enclosed in a matrix-forming material; surrounding the precursor to the multi-filament conductor with an insulating layer or a precursor to an insulating layer; forming the precursor to the multi-filament composite conductor as a coil; heat treating the coil after the forming step by exposing the coil to high temperatures in an oxidizing environment, the superconductor precursor filaments being oxidized and the matrix-forming material reversibly weakening during the heat treating step, with the composition and thickness of the insulating layer or precursor to the insulating layer begin chosen to encase the matrix-forming material and the superconductor precursor filaments, and to permit exposure of the superconductor precursor filaments to oxygen during the heat treating step. The heat treating step results in the improvement of the electrical and mechanical properties of the superconductor precursor filaments, and in the formation of a superconducting magnetic coil.

By "surrounding" the eventual multi-filament composite conductor with an insulating layer (or precursor to an insulating layer), direct contact between adjacent conductors is prevented. By "encasing" the matrix-forming material and the superconducting precursor filaments during the heat treating step, the insulation layer (or precursor to the insulation layer) preserves the integrity of the coil during the heat treatment. By "reversibly weakening" the matrix-forming material is left essentially without mechanical strength during the heat treating step, with the material substantially regaining mechanical stability following processing.

Preferably, the heat treating step involves heating and then cooling the coil in an environment comprising oxygen, and results in the conversion of the superconductor precursor filaments to a desired superconducting material, and in the repair of micro-cracks formed in the filaments during the forming step.

In preferred embodiments, the heat treating step features heating the coil from room temperature at a rate of about 10° C./min. until a temperature between 765° C. and 815° C., and preferably 787° C. is obtained; heating the coil at a rate about 1° C./min. until a maximum temperature between 810° C. and 860° C. and preferably 830° C. is obtained; heating the coil at the maximum temperature for a time between 0.1 and 300 hours, and preferably for 40 hours; cooling the coil at a rate of about 1° C./min until a temperature between 780° C. and 845° C., and preferably 811° C., is obtained; heating the coil at this temperature for a time period in the range of 1 to 300 hours, and preferably for 120 hours; cooling the coil at a rate of about 5° C./min. to a temperature between 765° C. and 815° C., and preferably 787° C.; heating the coil at this temperature for a time period between 1 and 300 hours, and preferably for 30 hours; and, finally cooling the coil at a rate of about 5° C./min. until a temperature of 20° C. is reached, with the heat treating steps performed in an atmosphere which consists primarily of gaseous oxygen at a pressure of about 0.001 to 1 atm, and preferably at 0.075 atm.

In one preferred embodiment of the invention, the coil is formed by repeating the steps of first winding a layer of the precursor to the multi-filament composite conductor around a mandrel, and then winding a layer of material comprising an insulating material or a precursor to an insulating material on top of the precursor to the multi-filament composite conductor. In another preferred embodiment of the invention, the precursor to the insulating material is initially a liquid mixture of a solvent and dispersant, and a particulate material, with the mixture being applied by dipping the precursor to the multi-filament composite conductor in the liquid mixture, followed by a heating step which results in the evaporation of the solvent and dispersant, and the formation of an insulating layer around the precursor to the multi-filament composite conductor. In a preferred embodiment of the invention, a heating step is used to remove impurities from the insulating material, such as dirt or a binder material.

In another preferred embodiment of the invention, the coil forming step features the step of concentrically winding the precursor to the multi-filament composite conductor to form a multi-layer coil having a "pancake" shape, with each of the layers wound to overlap the preceding layer. Each edge of the entire length of the precursor to the multi-filament composite conductor in this geometry is exposed to the oxidizing environment during a heat treating step. The heat treatment results in the oxidation and healing of micro-cracks in the superconductor filaments of the precursor to the multi-filament composite conductor, resulting in the formation of a multi-filament composite conductor. The "pancake" coil can be wound around a mandrel having an arbitrary shape. In preferred embodiments, the "pancake" coil is wound around a mandrel having a circular cross section. In alternate embodiments, the mandrel cross section is primarily elliptical in shape. In preferred embodiments, double "pancake" coils can be formed by winding a second "pancake" coil on the mandrel adjacent to the first "pancake" coil. In yet other preferred embodiments of the invention, multiple double "pancake" coils can be combined to form a single coil, and are preferably stacked in a coaxial manner.

In one particular aspect of the invention, a method for producing a superconducting magnetic coil, similar to the method described above, features subjecting the precursor to the multi-filament composite conductor to a bend strain in excess of its critical strain. In a particular embodiment of the invention, the precursor to the multi-filament composite conductor is subjected to a bend strain in excess of 0.3%.

In another particular embodiment, each layer of the multi-filament composite conductor of the coil consists of multiple conductors, with all of the conductors surrounded by a single insulating layer. Preferably, the multi-filament composite conductor has multiple superconducting filaments enclosed in a matrix-forming material composed of a noble metal or an alloy to a noble metal, and is preferably made of silver. In a particular embodiment, the superconducting material used for the filaments is selected from the oxide superconductor family, comprising the following materials: $(Bi, Pb)_2Sr_2Ca_{n-1}Cu_nO_{2n+4}$, where n is equal to either 1, 2, or members of the rare earth-copper-oxide family, such as YBCO (123), YBCO (124), and YBCO (247); members of the thallium-barium-calcium-copper-oxide family, such as TBCCO (1212) and TBCCO (1223); and, members of the mercury-barium-calcium-coper-oxide family, such as HgBCCO (1212) and HgBCCO (1223). Preferably, three-layer phase BSCCO is used for the superconducting filaments.

In preferred embodiments of this aspect of the invention, the multi-filament composite conductor is surrounded by an insulating layer which is permeable to gaseous oxygen and substantially chemically inert relative to the multi-filament composite conductor. In a preferred embodiment, an insulating material selected from the group containing $SiO_2$, $Al_2O_3$, and zirconia fibers is used as the insulating layer. Preferably, the insulating material is co-wound with the precursor to the multi-filament composite conductor. In alternate embodiments, the insulating material is wrapped around the precursor to the multi-filament composite conductor. Preferably, the thickness of the insulating layer is between 10 and 150 μm. In other embodiments, the insulating layer of the coil consists primarily of a particulate material selected from a group comprising $Al_2O_3$, MgO, $SiO_2$, and zirconia.

In particular aspects of the invention, a superconducting magnetic coil made with the method described above has an inner-coil diameter no larger than about 1 cm, or alternatively, the coil is wound so that the bend strain of the multi-filament composite conductor is greater than 0.3%. In other aspects of the invention, the winding density of the coil is greater than about 60%, the fill factor of the multi-filament composite conductor is greater than about 30%, the minimum critical-current is about 1.2 Amperes, and the magnetic field produced by the coil is in excess of about 80 Gauss.

In one aspect of the invention, a "pancake" coil is formed by the method described above. In a preferred embodiment, each layer of insulated multi-filament composite conductor of the "pancake" coil consists of multiple strands of multi-filament composite conductor, each having multiple superconducting filaments, with all strands surrounded by a single insulation layer. The conducting and insulating materials used in the "pancake" coil are the same as those described previously. In one embodiment of the invention, the coil is impregnated with a polymer. In a preferred embodiment, double "pancake" coils can be formed. Double "pancake" coils can be stacked coaxially and adjacent to each other. In certain preferred embodiments, the mandrel supporting the stacked coils is removed.

BRIEF DESCRIPTION OF THE DRAWINGS

Other objects, features and advantages of the invention will be apparent from the following description, taken together with the following drawings.

DESCRIPTION OF THE PREFERRED EMBODIMENTS

Insulated Composite Conductor

Figure 1:
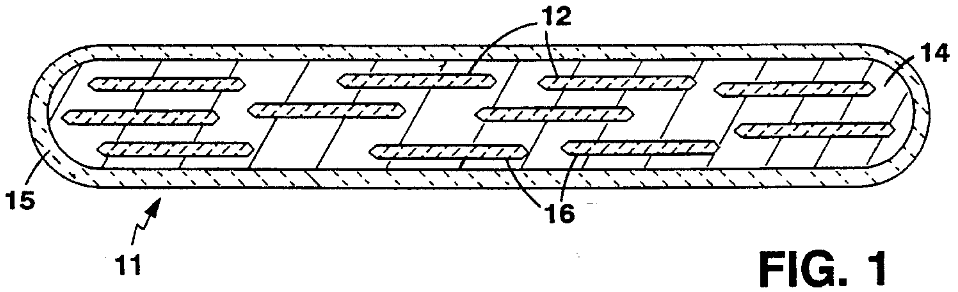
FIG. 1 is a cross-sectional view of a multifilament composite conductor.

Referring to FIG. 1, a multi-filament composite conductor 11 manufactured in accordance with the invention and used in a superconducting coil has superconducting regions 12 which are approximately hexagonal in cross-sectional shape and extend the length of the multi-filament composite conductor 11. Superconducting regions 12 form the filaments of the conductor, and are surrounded by a matrix-forming material 14, which is typically silver or another noble metal, which conducts electricity, but is not superconducting. Together, superconducting regions 12 and the matrix-forming material 14 form the multi-filament composite conductor.

In the Figure, the composite conductor is encased in an insulating ceramic layer 15. A standard "fill factor" describing the cross-sectional area encompassed by the superconducting regions 12 relative to the overall conductor cross-sectional area is 28%. The thickness of the ceramic insulation layer is typically on the order of 10 and 150 μm.

Figure 2:
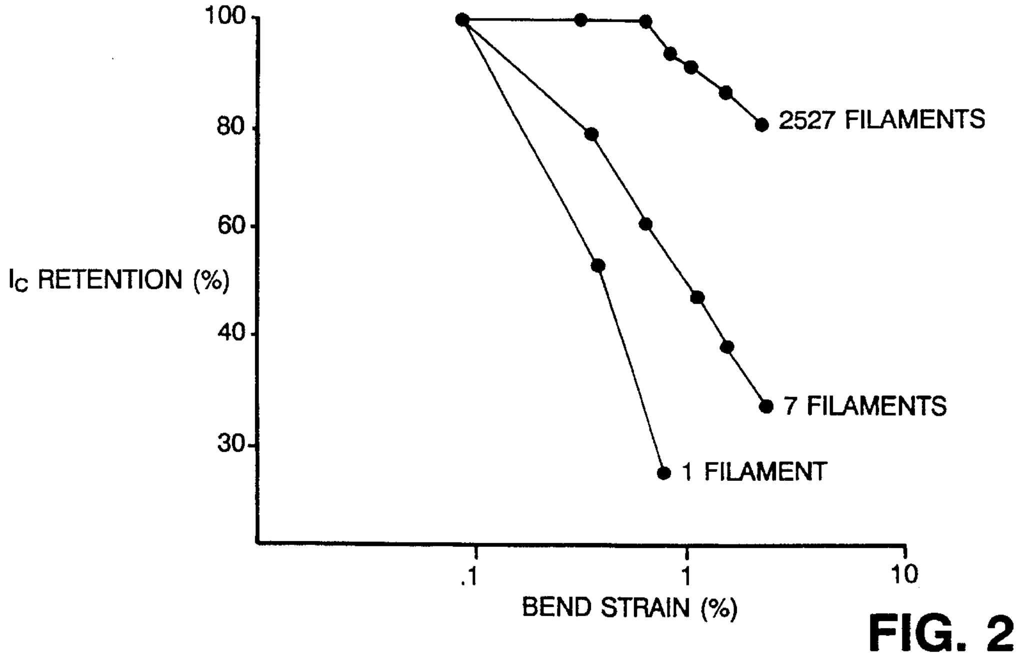
FIG. 2 iS a graph comparing the electro-mechanical properties of mono- and multi-filament composite conductors.

Multi-filament composite conductors offer many advantages over mono-filament composite conductors having similar fill factors. Referring now to FIG. 2, the electromechanical properties of multi- and mono-filament composite conductors are compared by plotting normalized critical-current density as a function of bend strain for different conductor samples having similar fill factors. The critical-current density of the mono-filament composite conductor approaches zero for bend strains near 1%, while the multi-filament composite conductor samples show a much weaker dependence on the bend strain. Both composite conductor samples had a thickness of 2.4 mm and a rectangular-shaped cross section, and were 10 cm in length. As the number of superconducting regions is increased from 7 to 2527, the conductive properties become less sensitive to bend strain, indicating the benefits of multi-filament composite conductors.

In the method of the present invention, the processing conditions used for the formation of the superconducting state have been inventively adapted to deal with problems unique to coils made with multi-filament composite conductors. In addition to the multi-filament composite conductor, materials used for insulation, mandrels, and other parts of the coil are subjected to the final heat treating process, and have been specifically chosen to adapt to the method of the present invention.

Wind-and-React Processing Method

Precursor Formation

The formation of the precursors to multi-filament composite conductors has been described previously, and will be discussed only briefly here (Riley et al., supra, and Sandhage et al., supra, the contents of which are incorporated herein by reference).

Figure 4:
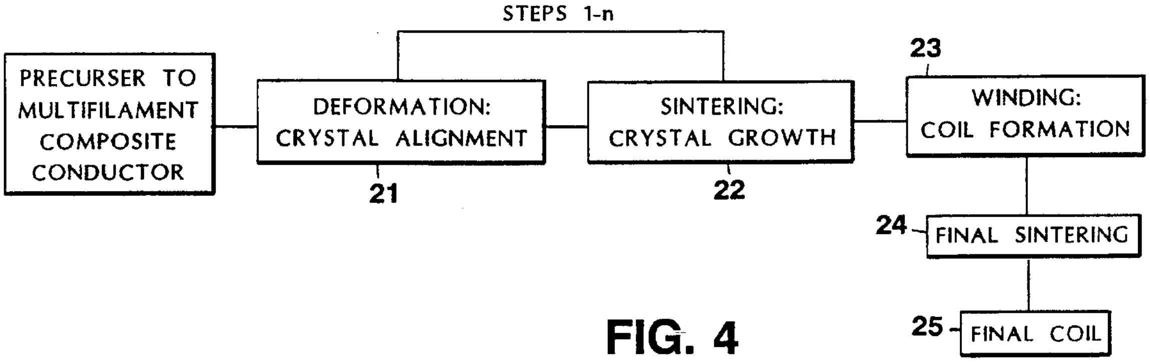
FIG. 4 is a block diagram of the wind-and-react coil formation process.

Referring now to FIG. 4, the steps of the wind-and-react manufacturing process for forming magnetic coils having strain-tolerant multi-filament composite conductors begins with the precursor to a multi-filament composite conductor 20 comprising filaments which consist of the ceramic precursor to the eventual superconducting material. The precursor to the multi-filament composite conductor is processed with two distinct steps: 1) a deformation through a pressing and/or rolling step 21, resulting in an alignment of the ceramic material along the c axis of the single crystal grains; and 2) a sintering step 22 involving heating the precursor to the conductor to temperatures in excess of 800° C. in an oxidizing environment, resulting in the formation of intergrannular connectivity. The precursor to the multi-filament composite conductor is returned to the deformation step 21 after being cooled. This results in crystallization and evolution of the superconducting grains, which is necessary, but not sufficient, for superconductivity. The deformation and sintering schedule is repeated iteratively from step 1 to step n-1, where n is an integer. The number of steps is chosen to optimize the final conduction properties of the target superconductor. For BSCCO (2223), the number "n" of steps is typically 2 or 3 using the heat treatments described herein.

Both the material and number of filaments used in superconducting regions can be changed to modify the electrical and mechanical properties of the eventual conductor. For example, in the BSCCO family, the number of layers of sheet-like CuO planes distinguish the different superconducting compounds. Along with BSCCO (2223), which has a three-layer phase, BSCCO (2201) (single-layer phase) and BSCCO (2212) (two-layer phase) are compounds which also exhibit superconductivity. BSCCO compounds may also contain lead which can result in the improvement of the chemical stability of the materials at high temperatures. The critical temperature ($T_c$) increases with increasing numbers of layers, with the single-layer phase having a $T_c$ of about 20 K., the two-layer phase having a $T_c$ of about 90 K., and the three-layer phase having a $T_c$ of about 115 K. Other desirable oxide superconductors, such as YBCO (123), TBCCO (1212) and TBCCO (1223), have values of $T_c$ in excess of 77 K.

A rebundling process results in fabrication of the precursors to multi-filament composite conductors having a variable number of sections, with each section containing multiple filaments (Sandhage et al., supra). Typically, using the described process, multi-filament composites composed of two sections have 7 filaments, composites composed of 3 sections have 19 filaments, and composites composed of 4 sections have 37 filaments.

Referring again to FIG. 1, the matrix-forming material 14 is chosen to surround the superconducting regions 12 because of the malleability and nobility of the metal with respect to the superconducting material. The matrix-forming material 14 also protects the superconducting regions 12 from chemical corrosion and mechanical abrasion, and enhances the stability of the superconducting regions 12 at cryogenic temperatures. Although silver is the preferred material, the matrix-forming material can also be made of other metals exhibiting similar mechanical, chemical, and electrical properties, such as alloys of silver and other noble metals. Insulation In the wind-and-react process, insulation (or a precursor to an insulating material) is applied to the precursor to the composite conductor prior to the final heat treating step. A particular method for applying insulation to wires used in react-and-wind coils has been described previously in Woolf, U.S. Pat. No. 5,140,006. The insulating methods and material parameters described herein have been specifically adapted for the wind-and-react method used to fabricate coils with multi-filament composite conductors.

The coil geometry imposes constraints on the insulation that are not present for individual wires. In the method of the present invention, ceramic insulation is chosen to insulate the multi-filament composite conductor because certain ceramic materials are permeable to oxygen, which allows exposure of the precursor to the composite conductor to an oxidizing environment during processing. Ceramic materials can also withstand the high temperatures an oxidizing environment of the processing conditions without suffering decomposition. Because insulation prevents electrical short circuits within the wound coil, ceramic materials are further desirable because they can withstand dielectric breakdown when exposed to electric fields as high as $4\times10^5$ V/cm. Other materials exhibiting electrical and mechanical properties similar to ceramic materials could also be used as insulation.

Wind-and-react coils formed with multi-filament composite conductors have different insulation thickness requirements than wind-and-react coils formed with mono-filament wires. It is well known in the art that thin superconducting regions are necessary to obtain high critical-current densities for the BSCCO family of superconductors. The optimum current-carrying performance for mono-filament composite conductors is normally achieved when the thickness of the superconducting regions is on the order of 10 μm. In comparison, the thickness of multi-filament composite conductors is a function of the number and configuration of the superconducting regions, and can be flexibly controlled. Thus, the ratio of the thickness of the insulation layer relative to the conducting region can be decreased in multi-filament composite conductors. This also allows robust multi-filament composite conductors to be fabricated which can be made arbitrarily thick, and far less susceptible to damage during processing steps than their necessarily thinner mono-filament counterparts.

During the final heat treatment, the insulation also acts as a casing which holds the matrix-forming material (which is considerably weakened during heat treating) and the superconductor precursor together, and therefore must not be susceptible to decomposition. Furthermore, it is undesirable for the insulating material to react with the composite precursor during the heat treating. Materials such as chromium, which may be present in some ceramic materials, can diffuse through silver and may react with the superconducting material. Quartz, alumina, zirconia, and magnesium are not able to diffuse through the silver matrix-forming material at high temperatures, and do not decompose when subjected to high temperatures, and thus represent suitable materials for insulation.

In some cases, the material used to insulate the conductor is considered to be a precursor until a heating step is performed, resulting in the formation of the insulating layer. Alternatively, the insulating material may not exist in a precursor state. In this case, a heating step may be used to remove dirt and other impurities, although such a heating step may not necessarily alter the chemical composition of the insulating material. In addition, a heating step may improve the mechanical properties of the insulation without changing the actual insulation properties.

Ceramic materials used as the precursors to insulation materials can be in the form of either a solid, such as a tape containing ceramic fibers, or a slurry, defined as a mixture of a solid particulate suspended by liquid. In a preferred embodiment, a cloth containing $SiO_2$fibers is used as the insulating material. This material does not exist in a precursor state, but a heating step may result in the removal of dirt and other impurities, thus improving the robustness of the cloth.

Suitable solid-based materials should be flexible so that they can be formed into a coil with the precursor to the conductor, while liquid-based materials should adhere to the precursor to the conductor, forming a continuous coating. Ceramic slurries and cloths both containing insulating materials may be used as the liquid-based and solid-based materials, respectively.

In a preferred embodiment of the present invention, a solid-based insulating layer is formed by attaching a cloth material composed of quartz fibers having a thickness between 10–250 μm and a width equal to the width of the precursor to the composite conductor. Quartz cloth is porous, and is chosen because of strength, flexibility, and its ability to resist degradation when exposed to high temperatures. In alternate embodiments, cloths woven from other ceramic fibers, such as zirconia and $Al_2O_3$, are used. Typically, a binder composed of an adhesive polymer is used to hold the fibers of the cloth together. The insulation can be applied by co-winding a single layer of the cloth during the coil formation step, or braiding multiple layers of the cloth around the precursor to the conductor at any time prior to the coil formation step. The binder of the ceramic insulating cloth can be removed by subjecting the insulation to a heating step following coil winding. This typically involves exposing the cloth to a temperature greater than about 450° C. for a time period of about 3 hours. Alternatively, the heat treating steps used to optimize the electrical and mechanical properties of the composite conductor can be used to remove the binder.

In an alternate embodiment, a liquid-based insulation layer is formed around the precursor to the multi-filament composite conductor as described in U.S. Pat. No. 5,140,006, which is herein incorporated by reference. The insulating layer is formed by first immersing the precursor to the multi-filament composite conductor in the slurry, resulting in adhesion of the particulate to its outer surface. The precursor to the conductor is then removed from the slurry, and subjected to a processing step consisting of heating the particulate material to a temperature of greater than 600° C. for a time period of about 15 hours, resulting in the calcination of the particulate material and the formation of the insulation layer. The liquid-based insulation layer can also be calcined during the heat treating steps of the processing method used to optimize the electrical an mechanical properties of the conductor. Both heating processes result in the formation of the ceramic insulating layer and the evaporation and decomposition of the solvent/dispersant, leaving a thin ceramic film having a thickness typically between 1 and 150 μm.

Coil Formation

Oxidation of the precursor to the multi-filament composite conductor during heat treatment is crucial to the overall performance of the superconducting material. Steps must therefore be taken to insure that precursors to composite conductors wound into coils have adequate access to the oxidizing environment. One way to accomplish this is by forming a "pancake" coil in which the precursor is formed into a tape and wrapped in concentric layers around a mandrel to form a spiral pattern, with each layer wound directly on top of the preceding inner layer. This allows the outer edge of the precursor to be exposed to the oxygen atmosphere along its entire length during the final step of the wind-and-react processing method.

Figure 5:
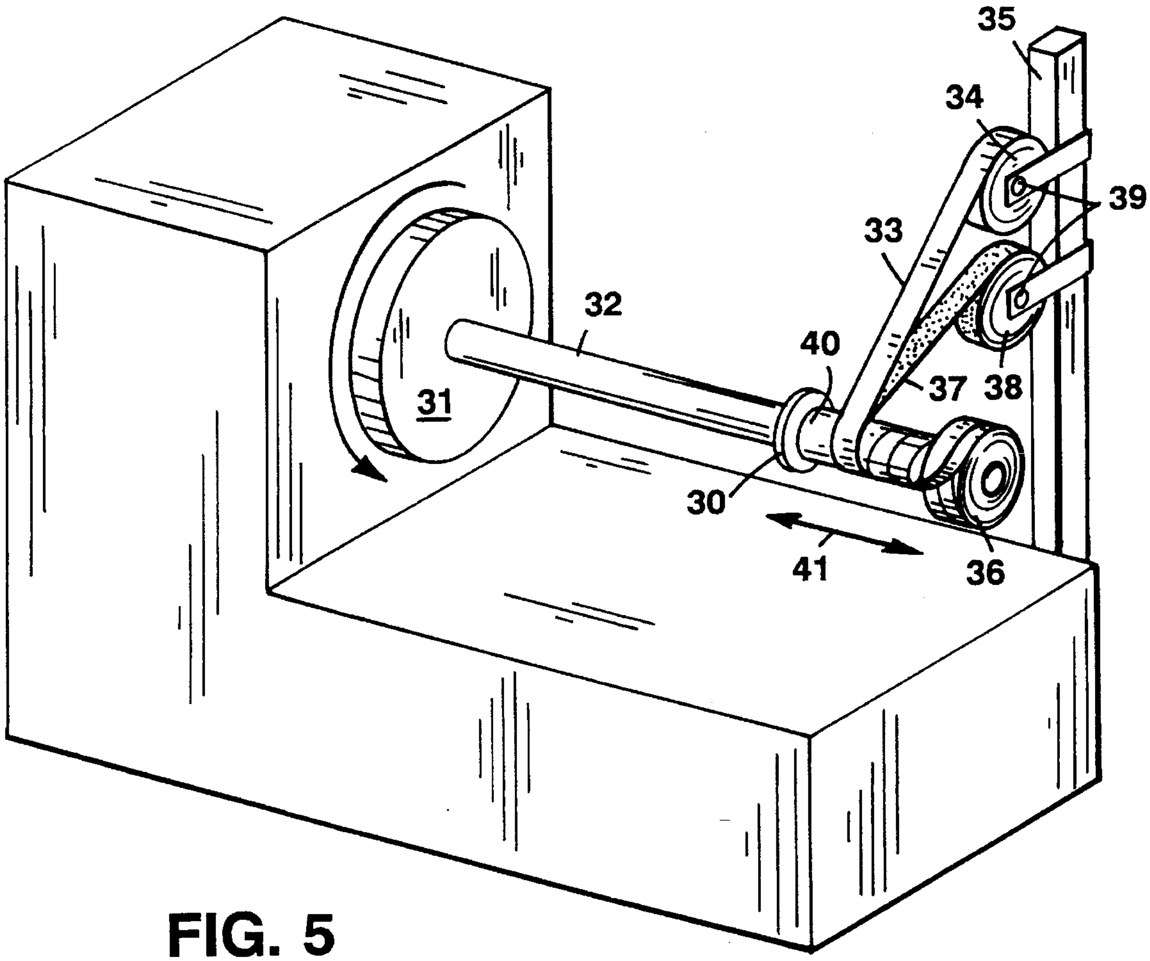
FIG. 5 illustrates a coil winding device.

Referring to FIG. 5, in a preferred embodiment of the invention, a mandrel 30 is held in place by a winding flange 32 mounted in a lathe chuck 31, which can be rotated at various angular speeds by a device such as a lathe or rotary motor. The precursor to the multi-filament composite conductor formed in the shape of a tape 33 is initially wrapped around a conductor spool 34, and a cloth 37 comprising an insulating material is wrapped around an insulation spool 38, both of which are mounted on an arm 35. The tension of the tape 33 and the cloth 37 are set by adjusting the tension brakes 39 to the desired settings. A typical value for the tensional force is between 1–5 lbs., although the amount can be adjusted for coils requiring different winding densities. The coil forming procedure is accomplished by guiding the eventual conducting and insulating materials onto the rotating material forming the central axis of the coil. Additional storage spools 36 are also mounted on the winding shaft 32 in order to store portions of the tape 33 intended to be wound after the initial portions of materials stored on spool 34 on the arm 35 have been wound onto the mandrel.

In order to form a coil 40, the mandrel 30 is placed on the winding shaft 32 next to storage spools 36 and the devices are rotated in a clockwise or counter-clockwise direction by the lathe chuck 31. In certain preferred embodiments of the invention, a "pancake" coil is formed by co-winding layers of the tape 33 and the cloth 37 onto the rotating mandrel 30. Subsequent layers of the tape 33 and cloth 37 are then co-wound directly on top of the preceding layers, forming a "pancake" coil having a height 41 equal the width of the tape 33. The "pancake" coil allows both edges of the entire length of tape to be exposed to the oxidizing environment during the heat treating step.

In other preferred embodiments of the invention, a double "pancake" coil may be formed by first mounting the mandrel 30 on the winding shaft 32 which is mounted in lathe chuck 31. A storage spool 36 is mounted on the winding shaft 32, and half of the total length of the tape 33 initially wrapped around spool 34 is wound onto the storage spool 36, resulting in the length of tape 33 being shared between the two spools. The spool 34 mounted to the arm 35 contains the first half of the length of tape 33, and the storage spool 36 containing the second half of the tape 33 is secured so that it does not rotate relative to mandrel 30. The cloth 37 wound on the insulation spool 38 is then mounted on the arm 35. The mandrel is then rotated, and the cloth 37 is co-wound onto the mandrel 30 with the first half of the tape 33 to form a single "pancake" coil. Thermocouple wire is wrapped around the first "pancake" coil in order to secure it to the mandrel. The winding shaft 32 is then removed from the lathe chuck 31, and the storage spool 36 containing the second half of the length of tape 33 is mounted on arm 35. A layer of insulating material is then placed against the first "pancake" coil, and the second half of the tape 33 and the cloth 37 are then co-wound on the mandrel 30 using the process described above. This results in the formation of a second "pancake" coil adjacent to the "pancake" coil formed initially, with a layer of insulating material separating the two coils. Thermocouple wire is then wrapped around the second "pancake" coil to support the coil structure during the final heat treatment. Voltage taps and thermo-couple wire can be attached at various points on the tape 33 of the double "pancake" coil in order to monitor the temperature and electrical behavior of the coil. In addition, all coils can be impregnated with epoxy after heat treating in order to improve insulation properties and hold the various layers firmly in place. The double "pancake" coil allows one edge of the entire length of tape to be exposed directly to the oxidizing environment during the final heat treating step.

In addition to providing oxygen access to the precursor to the superconducting material, the coil winding step can result in strengthening the matrix-forming material. Straining of silver, as well as other metals, during coil winding results in "strain hardening", a phenomenon which increases the ability of the metal to withstand an imparted stress. Because multi-filament composite conductors have metal regions surrounding the isolated superconducting regions, "strain hardening" strengthens the metal uniformly across the conductor cross section. This is not the case for mono-filament conductors, where the matrix-forming material surrounds the superconducting region in the core of the conductor, and "strain hardening" only strengthens the outer edges of the conductor.

Final Heat Treatment

After winding, the coil wound with the precursor to the multi-filament composite conductor is subjected to a final heat treating process, the general parameters of which have been described in detail (Riley et al., American Superconductor Corporation, "Improved Processing for Oxide Superconductors" S/N 08041822, U.S. Patent Pending) The final heat treating process of the present invention has been adapted to treat precursors to composite conductors wound into coils, and detailed descriptions of several final heat treating steps are included in the Examples described hereinafter.

The purpose of the final heat treatment is to convert the precursor to the composite conductor to the desired superconducting material, while at the same time heal microcracks and other defects incurred during winding. Typically, the final heat treatment involves heating the coil to a temperature in the range of 780°–860° C. for a period of time substantially in the range of 0.1 hr. to 300 hr., typically in an oxidizing environment having a $pO_2$ in the range of 0.001–1.0 atm.

During the final heat treating step of the present invention, two central processing problems specific to wind-and-react coils formed with the precursors to multi-filament composite conductors must be overcome: 1) proper oxygen access must be provided for the precursor; and 2) "sagging" of the precursor, induced by weakening of the matrix-forming material during heating, must be compensated for. Because of the strict geometric tolerances required for coils, the processing environment must not decompose the insulating material or cause detrimental "sagging" in the matrix-forming material.

The oxygen-access requirements for the precursors to multi- and mono-filament composite conductors differ because of the distribution of the superconducting precursor material in the composite. The increase in the relative surface area of the interfacial regions in the multifilament composite conductor allows for improved oxygen access to the oxide precursor during the heat treating step. As discussed in Okada et al., U.S. Pat. No. 5,063,200, the diffusivity of oxygen is much higher in a matrix-forming material made of silver than in the superconducting regions. The increase in the surface area of interfacial regions in the multi-filament composite conductor results in better exposure of the superconducting regions to oxygen, resulting in the optimization of the electrical properties of the superconducting oxide.

As discussed herein, oxygen access can be increased to the precursor of the superconducting material by using a ceramic insulation material having a suitable thickness. Oxygen access can also be increased by modifying the geometry of the coil in the furnace. To provide sufficient oxygen access, "pancake" or double "pancake" coils can be wound as described above. During the heat treating step, the coil can be placed on a oxygen-porous, honeycomb mantle to provide increased oxygen access to the coil during processing.

The presence of the mandrel also has to be accounted for in the wind-and-react process. The mandrel can become oxidized, and can also block oxygen access to the conductor. In a particular embodiment of the invention, the mandrel is made of silver, which is oxygen permeable at high temperatures, and thus allows increased exposure of the precursor to the multi-filament conductor to oxygen during processing. Furthermore, a mandrel composed of the same material as the matrix-forming material (ie., silver) will exhibit the same thermal expansion and contraction properties, thus reducing strain incurred during heating and cooling steps of the processing method.

The ability of the precursor to the multi-filament composite to undergo improved crack healing during the final heat treating step is also improved relative to mono-filament composites due to the increase in the superconductor/matrix-forming material interfacial regions. Because the surface-to-volume ratio of the superconducting region increases as the sizes of the individual regions are decreased, multi-filament composites will necessarily have an increased amount of interfacial regions when compared to mono-filament composites having the same fill factor. Successful crack healing depends on partial melting of the superconducting regions during processing, which leads to coexisting liquid and solid oxide phases of the superconducting material. Recrystallization back into the superconducting oxide phase results in crack healing. It is well known in the art that the presence of silver lowers the melting point of the superconducting precursor material. This effect will therefore be more prominent in multifilament composite conductors because of the increased surface area of interfacial regions.

In addition, the thermal conductivity of the silver matrix-forming material is significantly higher than that of the superconducting precursor material. The thermal gradient across the superconducting regions during processing will therefore be increased as the cross-sectional size of the region is increased. The decrease in size of the superconducting regions in the multi-filament composite conductors results in a more uniform heating field being applied to the superconducting material because of the increased interfacial region. This results in partial melting of the superconducting region of the multi-filament composite conductor occurring at a lower temperature and being more uniform than for mono-filament composite conductors.

When heated to the high temperatures of the final heat treating step, silver does not melt but is essentially left without strength. A conductor wound in a coil geometry can therefore "sag" or deform under its own weight, resulting in a decrease in the winding density. Furthermore, the complex winding densities used to provide the coil with sufficient oxygen access are more likely to expose the multi-filament composite conductor to non-uniform temperature distributions, resulting in unpredictable "sagging" of the composite conductor during heating. These problems are overcome by using a thermocouple wire, or other heat-resistant wire, to restrain the layers of insulated composite precursor during heat treatment. Coils can also be mounted with their central axis vertical in order to reduce the effects of "sagging".

Once the superconducting state is achieved, critical-current densities in the conductor are strongly dependent on filament thickness, conductor thickness, and filament position within the conductor. Filament thickness is typically on the order of 17 μm, and overall conductor thickness is typically 175 μm. Multi-filament composite conductors used in superconducting magnetic coils processed with the wind-and-react method can typically exhibit critical-current values between about 1–20 Amperes at 77° K. in self field, depending on the number of conductors surrounded by a single insulating layer. The values of the critical-current is particularly sensitive to the magnetic field perpendicular to the wide portion of the conductor surface.

Figure 6:
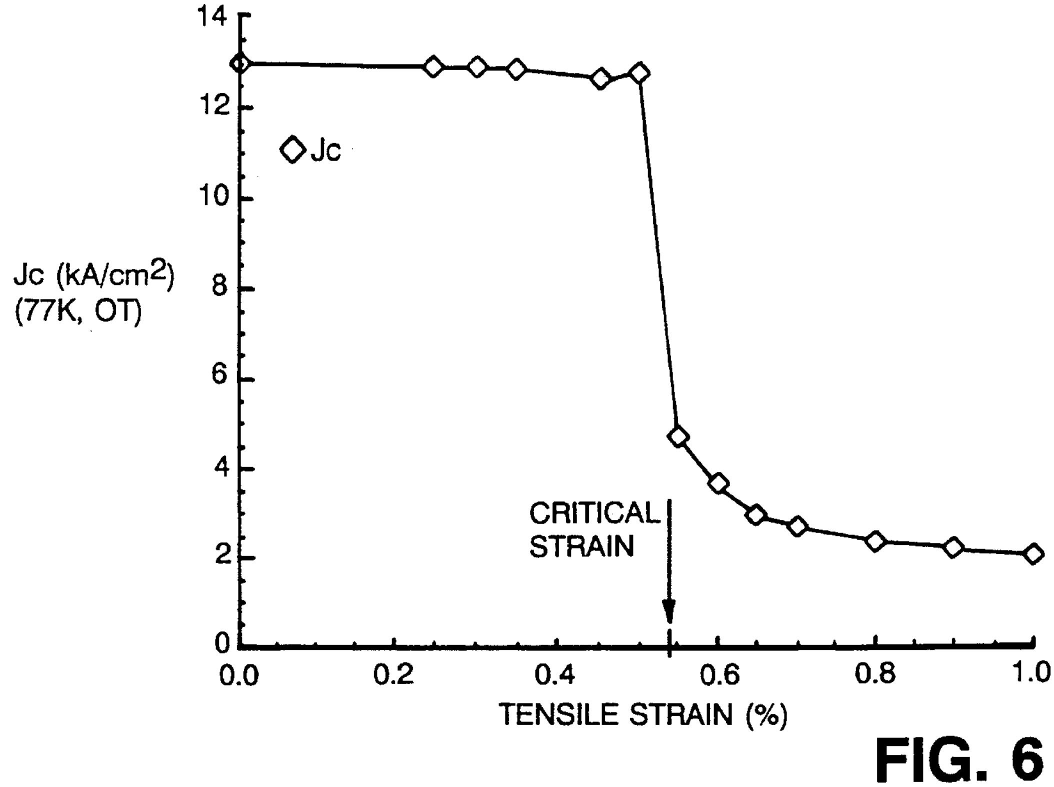
FIG. 6 is a graph illustrating the mechanical properties of superconducting multi-filament composite conductor manufactured in accordance with the invention.

Electro-Mechanical Properties of Multi-filament Composite Conductors Processed with the Wind-and-React Method Multi-filament composite conductors processed with the method of the present invention have higher strain tolerances than mono-filament composite conductors due to the strain-dependent properties of the superconducting regions and the matrix-forming material. For most superconducting materials, the critical current is independent of the amount of tensile strain (that is, strain associated with the tension of the conductor) unless the critical strain of the material is exceeded. When this occurs, the thickness of the induced micro-cracks is proportional to the tensile strain, and the maximum critical-current value supported by the superconductor is decreased significantly. This relationship between critical-current and tensile strain is illustrated in FIG. 6 for a sample of multi-filament composite conductor 15 cm in length and cut from one end of a 70 m long conductor. The critical-strain for this particular sample is about 0.54%. At strains exceeding the critical-strain value of the conductor, the critical-current decreases asymptotically towards about 2 $kA/cm^2$. If the local tensile strain is significantly greater than the critical strain value of the precursor to the conducting material, micro-crack formation can occur to such an extent that crack healing becomes impossible. Because critical strain values are typically much greater for multi-filament composite conductors compared to mono-filament composite conductors, it is possible to subject the superconducting region to higher tensional strains during coil winding without the conductor incurring irreparable damage.

A decrease in critical-current density for both multi- and mono-filament composite conductors can also occur when the current generating the magnetic field rapidly increases or decreases, or otherwise oscillates with time. In general, losses due to alternating currents in conductors can be reduced by subdivision of the superconducting regions, and will therefore be less severe for multi-filament composite conductors. A detailed discussion of this phenomenon can be found in M. N. Wilson, *Superconducting Magnets*, Monographs on Cryogenics, Clarendon Press, Oxford, 1983.

Figure 7:
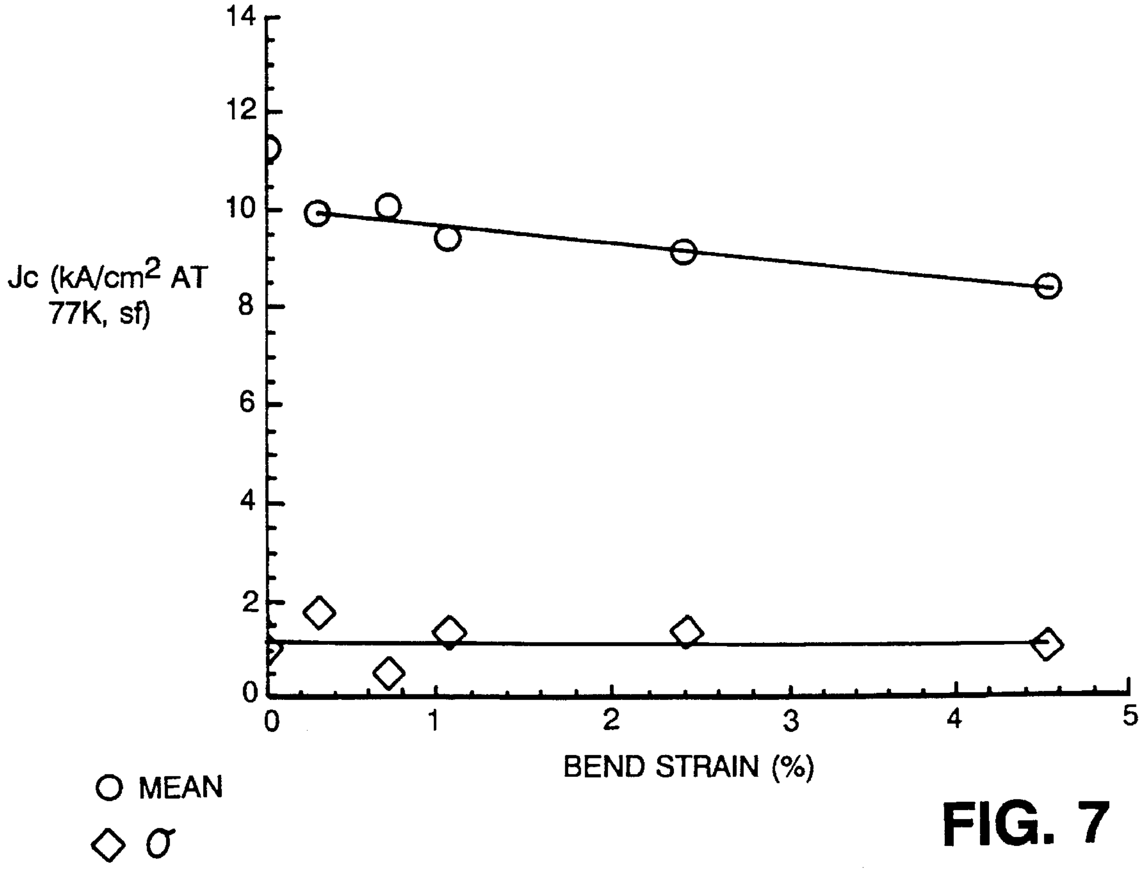
FIG. 7 is a graph showing critical-current density plotted against bend strain for a particular multi-filament composite conductor which was heat treated in accordance with the invention after being strained.

Referring now to FIG. 7, another advantage of the processing method in accordance with the present invention is illustrated by the graph which plots critical-current densities measured in BSCCO (2223) composite conductors as a function of bend strain. The critical strain values of the conductors were in the range of 0.3–0.5%. In the experiment, bend strain, normally incurred through winding, was simulated by bending composite conductors to various radii. After the bending, conductors were exposed to a sintering step. Following heating, the current density was measured across the bent section of the conductor.

The insensitivity and high value of the critical-current density supported by the conductor in the presence of bend strains in excess of the critical strain of the conductor clearly demonstrates the crack healing ability of a multi-filament composite conductor. Although critical-current density initially decreases by about 10% for small bend strains (from comparison with the critical-current value of about 11.2×103 $A/cm^2$ at zero bend strain), the critical-current density is relatively insensitive to values of bend strain up to nearly 5%. For a conductor thickness of 175 μm, a 5% bend strain corresponds to a bend radius of about 1.6 mm.

Figure 8:
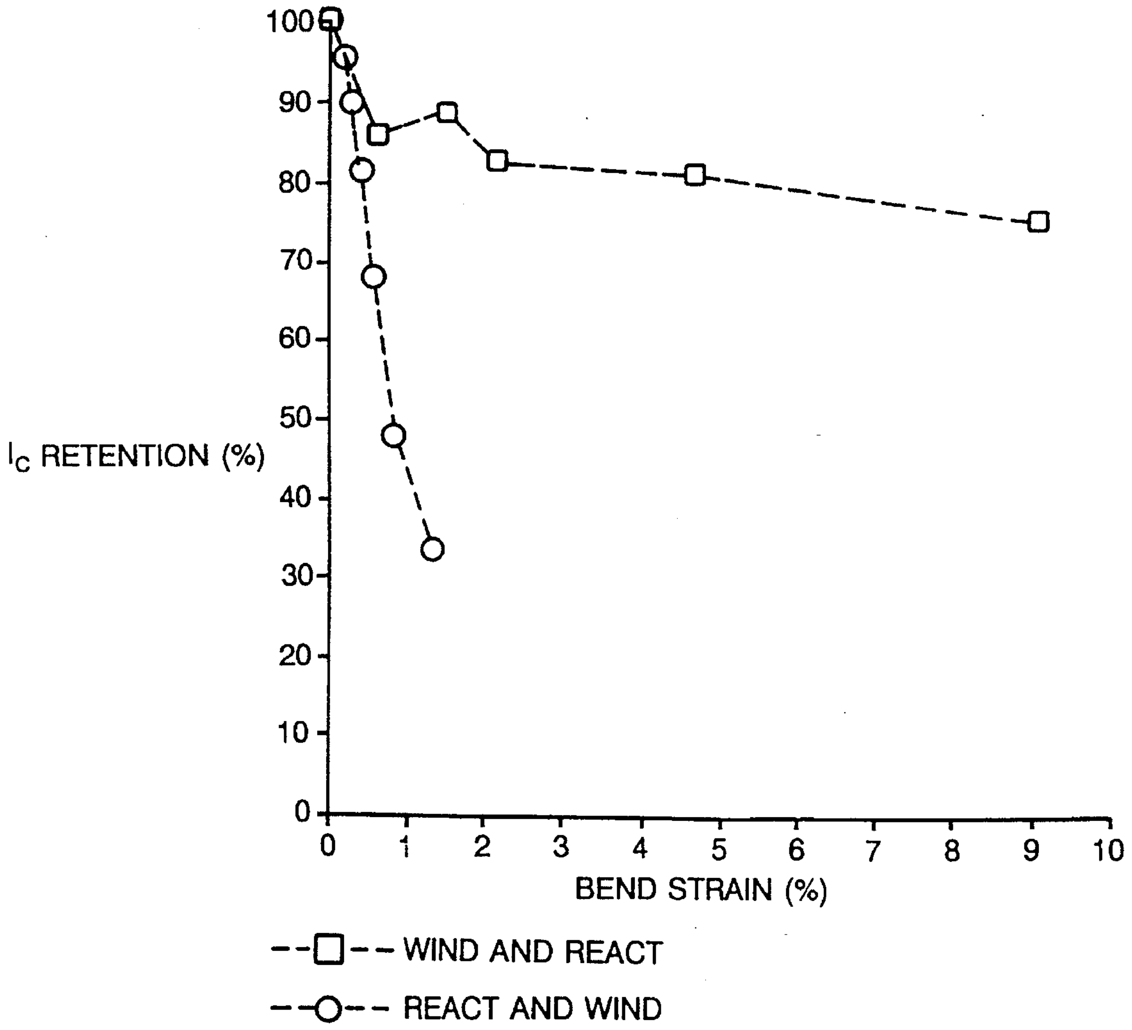
FIG. 8 is a graph comparing the electro-mechanical properties of composite conductors treated with wind-and-react and react-and-wind processing methods.

Referring now to FIG. 8, further benefits of wind-and-react processing of multi-filament composite conductors are illustrated by comparing the normalized critical-current density as a function of bend strain for multi-filament composite BSCCO (2223) conductors processed with different methods. Conductors processed with the wind-and-react processing method were first bent and then subjected to a final heat treating step, while the react-and-wind processing conditions comprised heat treating the conductor, inducing the desired bend strain, and finally measuring the current density across the bent section of the conductors.

At 1% bend strain, the critical-current density supported by the conductor treated under the react-and-wind processing conditions is reduced to 43% of its maximum value (measured at 0% bend strain). In comparison, at 1% bend strain, the critical-current density supported by the conductor treated under the wind-and-react processing conditions is minimally reduced to 85% of its maximum value, indicating the advantage of the processing method of the present invention.

Variations of Wind-and-React Coils

In commercial applications, the success of the wind-and-react processing method is dependent on the influence of the processing environment on the superconducting material. Principally, two factors contribute to this influence: 1) the susceptibility of the precursor of the eventual superconducting material to temperature during the sintering steps; and, 2) the permeability of silver to oxygen at temperatures in excess of 800° C. The first factor allows successful micro-crack healing by melting and recrystallizing the superconducting grains during the sintering (and the subsequent cooling) steps of the inventive method, and the second factor permits exposure of the precursor to the multi-filament composite conductor to oxygen, which facilitates micro-structural growth of the superconducting grains. Both factors will be influenced by the design and physical dimensions of the various coil types.

Because the coil is subjected to a final heat treating process, the design tolerances are of particular importance. The multi-filament composite conductors used to form the coils must have the length and width dimensions kept as uniform as possible. If multiple coils are to be stacked, it is important to fabricate coils having uniform geometric sizes, and to minimize deformation during the heat treating process. This ultimately results in final coil designs having high winding and packing densities, which are critical in determining the resultant magnetic field.

Figure 9:
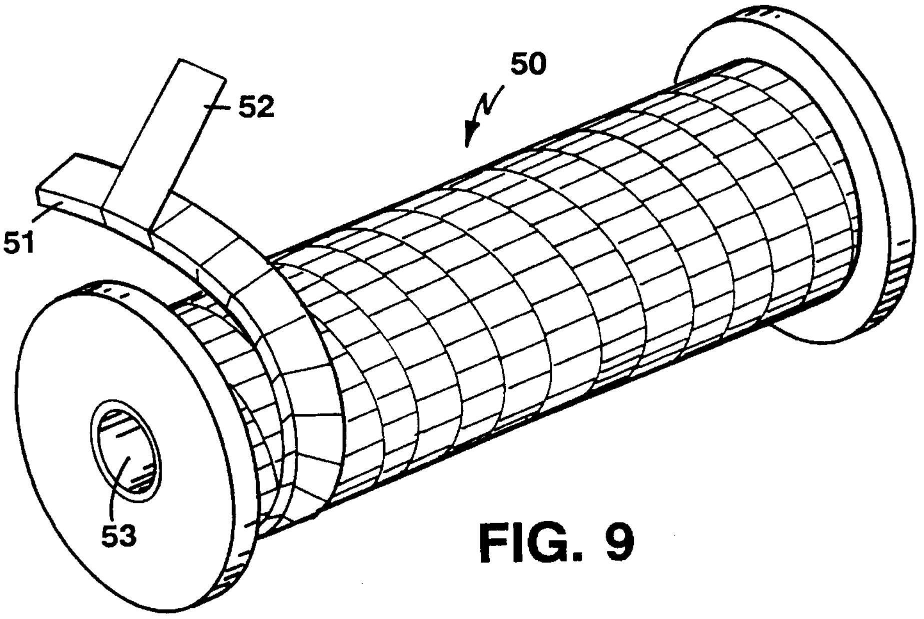
FIG. 9 shows a superconducting coil made with a multi-filament composite conductor using the wind-and-react process in accordance with the invention.

Referring now to FIG. 9, a layer-wound solenoid superconducting coil 50 processed by the wind-and-react method of the present invention has a mandrel 53 wrapped by a multi-filament composite conductor 51, which has a ceramic insulation covering 52 wrapped around it. The designs and thermal properties of the superconducting coil 50 and mandrel 53 have substantial influences on the heating and oxygenation of the superconducting material encased in the multi-filament composite conductor 51. For example, if the heat capacity of the mandrel 53 is large, the temperature cooling rates of the heat treating steps of the present processing method may have to be increased in order for the coil to thermally equilibrate at low temperatures in the required amount of time. Similarly, the amount of heat transferred from mandrel 53 to the multi-filament composite conductor 51 will be dependent on the size of the mandrel, with larger mandrels dissipating more heat to the surrounding conductor than smaller mandrels.

Figure 10:
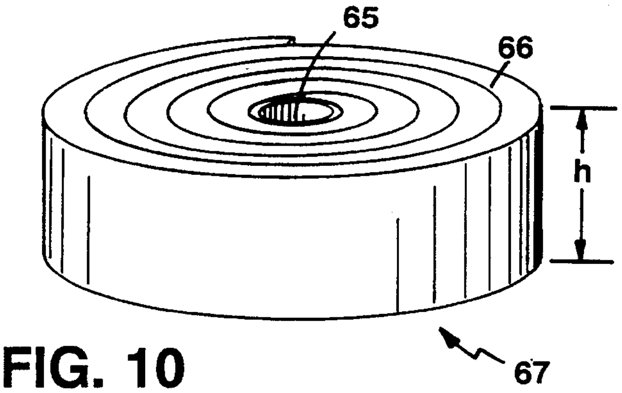
FIG. 10 shows a superconducting coil in the "pancake" geometry made in accordance with the invention.
Figure 10A:
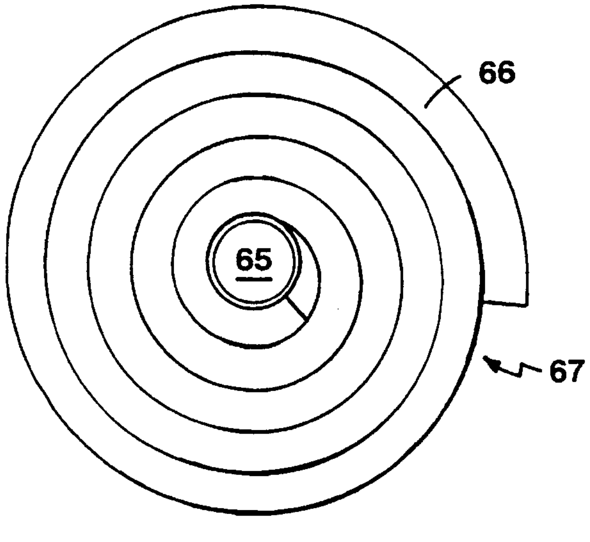
FIG. 10*a* shows a side view of the coil.

Referring now to FIGS. 10 and 10*a*, a preferred embodiment of the "pancake" superconducting magnetic coil 67 wound with multi-filament composite conductor 66 is shown. To ensure that the multi-filament composite conductor 66 receives acceptable exposure to oxygen during the final sintering step of the wind-and-react process, the precursor to the multi-filament composite conductor, which has a flattened ribbon or tape configuration, is wrapped in layers concentrically around a mandrel 65 forming a spiral pattern. Each layer is wound directly on top of the preceding inner layer, making the height h of the coil 67 equal to the width of tape. FIG. 10*a* shows a top view of the illustrated embodiment of the conductor in FIG. 10, and illustrates how the outer edge of the precursor to the composite conductor is exposed to the oxygen atmosphere along its entire length during the heat treating step of the wind-and-react processing method.

The "pancake" coil 67 is desirable because it provides a configuration in which the multi-filament composite conductor 66 has a high winding density, while maintaining suitable oxygen exposure for the multi-filament composite conductor 66 during the final heat treatment step. In an embodiment of the present invention, approximately 20 layers of the precursor to the multi-filament composite conductor are used to wrap the mandrel 65, with the total length used being about 100 cm. Using a BSCCO (2223) conductor with 19 filaments, the illustrated embodiment of the invention is capable of supporting a current of about 15 Amperes at 77 K., with an associated magnetic field being as large as about 100 Gauss. This coil is expected to perform at a higher level than a coil having a layer-wound configuration (FIG. 9) treated with the wind-and-react processing method. For this latter case, only the outer surface of the winding is exposed to the oxidizing atmosphere during final processing, and the electrical properties of the conducting material are thus expected to be inferior.

In an alternate embodiment of the present invention, free-standing "pancake" coils can be fabricated by removing the mandrel from the center of the coil. This embodiment can be desirable because elimination of the mandrel results in reduced cycling stress which results from thermal expansion of the mandrel during heating and cooling steps.

Figure 10B:
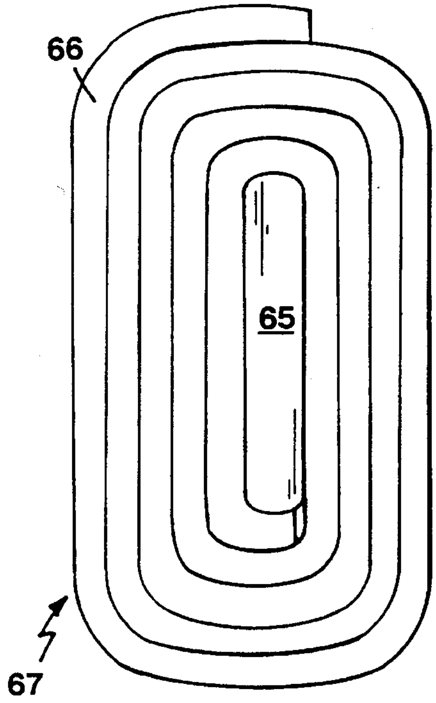
FIG. 10*b* shows a side view of a primarily elliptical "racetrack" coil.

Referring now to FIG. 10*b*, in another alternate embodiment of the present invention, the "pancake" coil can be formed around a mandrel having a cross section with a primarily elliptical, "racetrack" shape rather than the circular cross section of the "pancake" coil illustrated in FIG. 10*a*. In other alternate embodiments of the present invention, mandrels having arbitrary shapes and sizes can be used to support the multi-filament composite conductor.

In another preferred embodiment of the invention, double "pancake" coils having circular or primarily elliptical ("racetrack") shaped cross sections can be formed using the winding process described herein. This coil geometry comprises two adjacent single "pancake" coils wound from a single tape comprising the precursor to a multifilament composite conductor, with the adjacent coils sharing the same central axis. In this geometry, each end of the tape forming the two coils is on the outer surface of the coil, thereby eliminating electrical connections inside the coils.

In another alternate embodiment of the invention, the winding density of the coil may be increased by co-winding two or more portions of tape comprising the precursor to the multi-filament composite conductors together with a single cloth comprising the precursor to an insulating material, and then forming the cloth and tape into a single or double "pancake" (or "racetrack") coil. Co-winding multiple strands of conductor in this fashion is effectively the same as wiring multiple conductors in parallel, and coils formed in this manner can achieve even higher winding densities while minimizing the amount of insulation in the coil.

Figure 11:
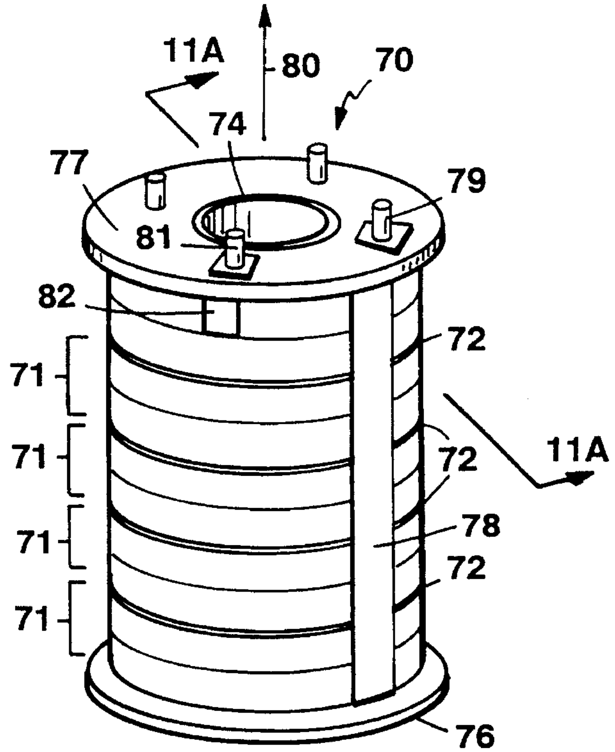
FIG. 11 shows multiply stacked "pancake" coils.
Figure 11A:
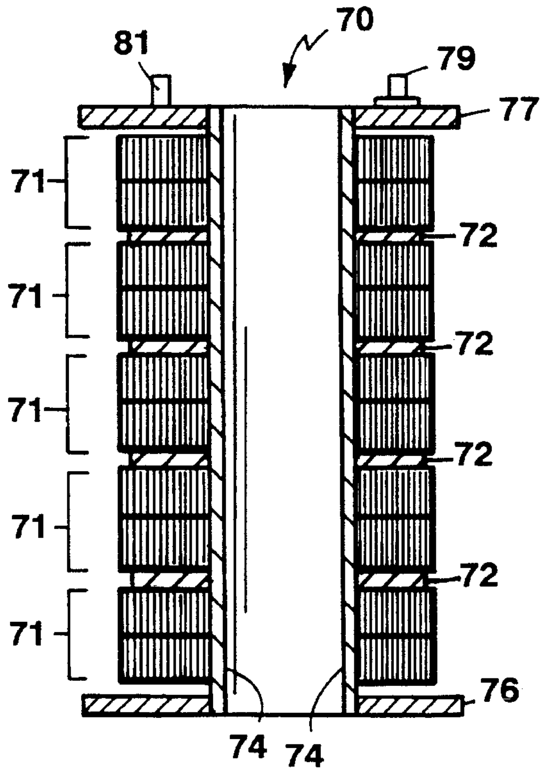
FIG. 11*a* shows a cross-sectional view of FIG. 11 taken along line 11*a*—11*a*.

Referring now to FIG. 11, which shows a side view of another preferred embodiment of the invention, and FIG. 11*a*, which shows a cross-sectional view of the same embodiment, a mechanically robust, high-performance superconducting coil assembly 70 combines multiple double "pancake" coils 71 each having co-wound multi-filament composite conductors. In the coil assembly 70, double "pancake" coils 71 having four co-wound conductors wound in parallel are stacked coaxially on top of each other, with adjacent coils separated by a layer of ceramic insulation 72. A tubular mandrel 74 supports the coils 71. End flange 77 is welded to the top of the tubular mandrel 74, and end flange 76 threads onto the opposite end of the tubular mandrel 74 in order to compress the double "pancake" coils 71. In an alternate embodiment, the tubular mandrel 74 and the two end flanges can be removed to form a free-standing coil assembly.

A segment of superconducting material 78 is used to connect the double "pancake" coil adjacent to end flange 76 to termination post 79 located on end flange 77. Individual coils are connected in series with short segments of superconducting material, and an additional length of superconducting material 82 connects the double "pancake" coil adjacent to end flange 77 to termination post 81. These electrical connections allow current to flow from termination post 81, through the individual coils, to termination post 79. The current is assumed to flow in a counter-clockwise direction, and the magnetic field vector 80 is normal to the end flange 77 forming the top of coil assembly 70.

Figure 3:
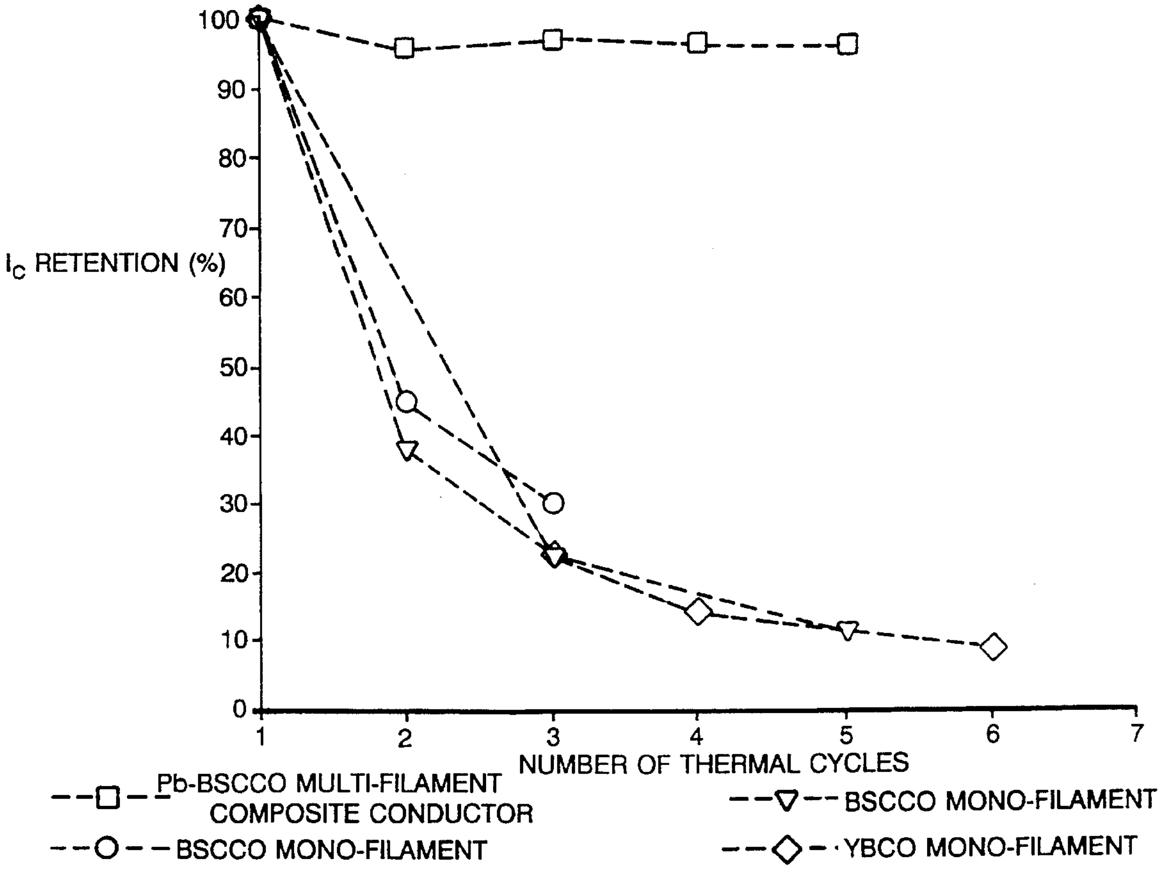
FIG. 3 is a graph comparing the electrical properties of coils made with mono- multi-filament composite conductors as a function of thermal cycles.

A particular advantage of coils featuring multifilament composite conductors is related to the thermal fatigue incurred through heating and cooling the coil, and is illustrated by the plot in FIG. 3. The Figure plots the retention of critical-current for composite conductors (wound into coils) as a function of thermal cycles, which are defined as the processes of cooling the coil down to cryogenic temperatures and then heating the coil back to room temperature. Due to the inherent lack of flexibility of the mono-filament composite conductor, the coil performance is decreased severely after 5 thermal cycles, with the critical-current retention dropping to 10% of its maximum value. In contrast, the coil wound with multi-filament composite conductor shows no significant decrease in coil performance after 5 thermal cycles, with the critical-current density retaining greater than 95% of its maximum value.

EXAMPLES

The following Examples are used to describe the wind-and-react processing method of the present invention.

Example 1—Layer-Wound Solenoid Coil

The precursor to the superconducting phase of BSCCO (2223) was packed into a silver tube having an inner diameter of 1.59 cm, a length of 13.97 cm, and a wall thickness of 0.38 cm to form a billet. A wire was then formed by initially extruding the billet to a diameter of 0.63 cm, with subsequent drawing steps reducing the wire cross section to a hexagonal shape 0.18 cm in width. Nineteen similar wires were then bundled together and drawn through a round die having a diameter of 0.18 cm to form a precursor to a multi-filament composite conductor having a circular cross section. The precursor was then rolled to form a multi-filament composite tape 30 m in length having a rectangular (0.25 cm×0.03 cm) cross section. A single layer of Nextel ceramic fiber having a thickness of 0.002 cm was braided around the multi-filament composite tape prior to the final sintering.

The layer-wound solenoid coil was formed by winding the insulated multi-filament composite tape around a cylindrical mandrel having height of 3.00 cm and a diameter of 1.27 cm. Two circular flanges, each having a diameter of 6.01 cm, were welded to each face of the mandrel. Both the mandrel and circular flanges were composed of Haynes 214, a nickel-based alloy. Radial slots were cut into each flange to promote oxygen access to the multi-filament composite tape during the final heat treating process.

A section of composite tape was then wound once around the perimeter of the mandrel, creating a bend strain of about 6% in the conductor precursor. A layer of thermocouple wire was wrapped around the composite tape, thus securing it to the mandrel. Two silver foil electrical terminations were connected to the initial segments of the multi-filament composite tape to form the current and voltage leads. A single layer of the multi-filament composite tape was then wound helically along the length of the mandrel. The winding process was repeated using the remaining portions of the composite tape, resulting in 30 layers being wound onto the mandrel. The final segment of the composite tape was secured to the mandrel with thermocouple wire, and electrical leads were attached as described above.

The superconducting phase of the multi-filament composite tape was formed by processing the solenoid coil with a final heat treating step comprising the steps of: 1) heating the coil from room temperature at a rate of 1° C./min to a temperature of 820° C. in 0.075 atm $O_2$; 2) heating the coil at 820° C. for 54 hours; 3) cooling the coil to 810° C. and holding for 30 hours; and 4) allowing the coil to cool to room temperature in 1 atm $O_2$.

Electrical properties of the coil were monitored using the voltage and current leads attached to the initial and final segments of the insulated multi-filament composite conductor. The critical current of the coil at 77° K. was measured to be 1.6 Amperes, with the magnetic field in the center of the coil calculated to be 150 Gauss.

Example 2—"Pancake" Coil

The precursor to the multi-filament composite conductor was formed using the deformation and rebundling processes described in Example 1, and then rolled to form a 2.7 m long multi-filament composite tape having a thickness of 0.02 cm and a width of 0.25 cm. A Nextel ceramic fiber having an adhesive binder was braided around the composite tape prior to coil formation.

A single layer of composite tape was then wound onto a mandrel made from Haynes 214 alloy and having a bore diameter of 1.25 cm, creating a bend strain in the multi-filament composite tape similar to the value described in the previous Example. Thermocouple wire and electrical terminations (voltage and current leads) were attached to the initial layer of composite tape as described in Example 1. A 28-layer "pancake" coil having an outer diameter of 6.73 cm was formed by winding the remaining length of the multi-filament composite tape onto the mandrel, with each successive turn forming a layer of composite tape directly on top of the previous layer. Electrical terminations and thermocouple wire were attached to the outer layer of the multi-filament composite tape as described in Example 1. Following the winding process, the "pancake" coil was subjected to two separate heat treating processes. The initial process was used to remove the adhesive binder from the Nextel ceramic fiber insulating layer, and comprised the steps of: 1) heating the coil from room temperature to 550° C. at a rate of 5° C./min; 2) heating the coil at 550° C. for 15 hours; and 3) allowing the coil to cool to room temperature. The formation of the superconducting phase in the insulated composite tape was accomplished with a final heat treating step, comprising the steps of: 1) heating the coil from room temperature to 890° C. at a rate of 10° C./min in 0.75 atm $O_2$; 2) immediately cooling the coil at a rate of 10° C./min to 810° C.; 3) heating the coil at 810° C. for 100 hours; 4) cooling the coil at a rate of 10° C./min to 700° C.; and 5) allowing the coil to cool to room temperature.

Electrical properties of the "pancake" coil were monitored using the voltage and current leads attached to the initial and final layers of the coil. The critical current of the coil at 77° K. was measured to be 1.35 Amperes, with the magnetic field in the center of the coil calculated to be 85 Gauss.

Example 3—Double "Pancake"Coil

The multi-filament composite tape was formed using the deformation and rebundling processes described in Example 2. Four different sections of multi-filament composite tape and a section of quartz cloth were then wound onto five separate spools, each of which was mounted on the arm of the coil winding device shown in FIG. 5.

Using the double "pancake" winding procedure described previously, portions of the four sections of multi-filament composite tape were then co-wound with the quartz cloth onto a mandrel made of silver and having an internal diameter of 2.86 cm. A single layer of the coil thus comprised four portions of composite tape wound on top of each other, with a single portion of quartz cloth wound on top of the forth layer. The bend strain of the composite tape in the first layer of the coil was estimated to be 0.50%. The co-winding procedure for the double "pancake" coil was repeated to form two "pancake" coils, each having 55 layers, with the coils separated by a thin insulating sheet comprising quartz fibers. The final outer diameter of the double "pancake" coil was approximately 10.8 cm.

The binder was removed from the insulation layer using the initial heat treating process described above. The formation of the superconducting phase in the insulated multi-filament composite tape sections of the double "pancake" coil was accomplished with a final heat treating step comprising the steps of: 1) heating the coil at a temperature of 20° C. for 1 hour; 2) increasing the temperature at a rate of 10° C./min to 789° C.; 3) increasing the temperature at a rate of 1° C./min to 830° C.; 4) heating the coil at 830° C. for 40 hours; 5) cooling the coil at a rate of 1° C./min to 811° C.; 6) heating the coil at 811° C. for 120 hours; 7) cooling the coil at a rate of 5° C./min to 787° C.; 8) heating the coil at 787° C. for 30 hours; and, 9) cooling the coil at rate of 5° C./min to cool to room temperature. The atmosphere was comprised of 7.5% $O_2$ for all steps of the final heat treating step. Following the processing steps, the mandrel was removed and the double "pancake" coil was impregnated with epoxy in order to hold the layers of insulation and composite tape firmly in place.

Electrical properties of the double "pancake" coil were monitored using the voltage and current leads attached to the ends of the superconducting composite tape located on the outside surface of each "pancake" coil. The critical current of the coil at 77° K. was measured to be 18.9 Amperes, with the self field calculated to be 250 Gauss.

Example 4—Stacked Double "Pancake" Coils

Eight double "pancake" coils were individually fabricated and heat treated as described in Example 3. After removing each of the mandrels, the coils were then co-axially stacked on top of each other and supported by an aluminum tube having a height of 7.60 cm and a diameter of 2.86 cm which was placed through the center of the coils. An aluminum flange was welded to the top of the tube, and another flange was threaded to the bottom section of the tube in order to compress the pancake coils together. Termination posts were attached to the top portion of the end flange in order to monitor the current and voltage values of the coil.

In order to join individual coils together in a series circuit, electrical connections consisting of short lengths of multi-filament composite tape containing superconducting BSCCO (2223) were soldered to the ends of the composite tape located on the outside surface of each double "pancake" coil. Similar lengths of multi-filament composite tape were used to make current leads from the termination post to the coil. Resistive losses due to the soldered electrical terminations used to connect the coils in series were measured to be in the μΩ regime. The critical current density of the stacked coils was similar to the value measured in Example 3, and the calculated field in the center of the coil was approximately 4,000 Gauss at 77° K.

The foregoing descriptions of preferred embodiments of the processing methods and related inventions have been presented for purposes of illustration and description. They are not intended to be exhaustive or to limit the invention to the precise form disclosed. The embodiments chosen are described in order to best explain the principles of the processing method and invention.

What is claimed is:

1. A method for producing a superconducting magenetic coil comprising the steps of:

fabricating a precursor to a multi-filament composite conductor comprising multiple superconductor precursor filaments enclosed in a matrix-forming material, surrounding said precursor to said multi-filament composite conductor with one of an insulating layer and a precursor to an insulating layer, forming said precursor to said multi-filament composite conductor as a coil, and heat treating said coil after said forming step by exposing said coil to high temperatures and an environment comprising oxygen, said superconductor precursor filaments being oxidized and said matrix-forming material reversibly weakening during said heat treating step, a composition and thickness of one of said insulating layer and said precursor to said insulating layer chosen to encase said weakened matrix-forming material and said superconductor precursor filaments and to permit exposure of said superconductor precursor filaments to oxygen during said heat treating step, said heat treating step resulting in formation of a superconducting magnetic coil.

2. The method of claim 1, wherein said step of heat treating comprises the steps of:

heating and cooling said coil in an environment comprising oxygen, said heat treating step resulting in conversion of said superconductor precursor filaments to a desired superconducting material.

3. The method of claim 2, wherein said step of heat treating results in repair of micro-cracks in said filaments.

4. The method of claim 2, wherein said step of heat treating comprises the steps of:

heating said coil at a rate of about 10° C./min until a temperature between 765° C. and 815° C. is obtained, heating said coil at a rate of about 1° C./min until a maximum temperature between 810° C. and 860° C. is obtained, heating said coil at said maximum temperature between 810° C. and 860° C. for a time period between 0.1 and 300 hours, cooling said coil at a rate of about 1° C./min. until a temperature between 780° C. and 845° C. is obtained, heating said coil at said temperature between 780° C. and 845° C. for a time period in the range of 1 to 300 hours, cooling said coil at a rate of about 5° C./min. until a temperature between 765° C. and 815° C. is obtained, heating said coil at said temperature between 765° C. and 815° C. for a time period in the range of 1 to 300 hours, cooling said coil at a rate of about 5° C./min. until a temperature of about 20° C. is obtained, said heat treating step being performed in said environment comprising oxygen, wherein the pressure of said oxygen is between about 0.001 and 1.0 atm.

5. The method of claim 2, wherein said step of heat treating comprises the steps of:

heating said coil at a rate of 10° C./min. until a temperature of 789° C. is obtained, heating said coil at a rate of 1° C./min. until a maximum temperature of 830° C. is obtained, heating said coil at said maximum temperature of 830° C. for a time period of 40 hours, cooling said coil at a rate of 1° C./min until a temperature of 811° C. is obtained, heating said coil at said temperature of 811° C. for a time period of 120 hours, cooling said coil at a rate of 5° C./min. until a temperature of 787° C. is obtained, heating said coil at said temperature of 787° C. for a time period of 30 hours, cooling said coil at a rate of 5° C./min. until a temperature of 20° C. is obtained, said heat treating step being performed in said environment comprising oxygen, wherein the pressure of said oxygen is 0.075 atm.

6. The method of claim 1, wherein said surrounding step comprises the steps of:

immersing said precursor to said multi-filament composite conductor in a liquid mixture comprising one of a solvent, dispersant, and both a solvent and dispersant, and a particulate material, and then removing said precursor to said multi-filament composite conductor from said liquid mixture, and heating said precursor to said multi-filament composite conductor after said immersing and removing steps, said heating resulting in the evaporation of one of said solvent, dispersant, and both said solvent and said dispersant, and resulting in the formation of an insulating layer around said presursor to said multi-filament composite conductor.

7. The method of claim 1, wherein said surrounding step comprises the steps of:

wrapping an insulating material around said precursor to said multi-filament composite conductor, heating said precursor to said multi-filament composite conductor after said wrapping step, said heating resulting in the removal of impurities from said insulating material.

8. A method for producing a superconducting magnetic coil, comprising the steps of:

winding one layer of a precursor to a multi-filament composite conductor comprising multiple superconductor precursor filaments enclosed in a matrix-forming material around a mandrel to form a precursor layer, winding one layer of a material comprising one of an insulating material and a precursor to an insulating material on top of said precursor layer to form a composite layer, forming a plurality of said composite layers by repeating said winding steps, said plurality of composite layers forming said coil, and heat treating said coil after said forming step by exposing said coil to high temperatures and an environment comprising oxygen, said superconductor precursor filaments being oxidized and said matrix-forming material reversibly weakening during said heat treating step, a composition and thickness of one of said insulating material and said precursor to said insulating material chosen to encase said weakened matrix-forming material and said superconductor precursor filaments, and to permit exposure of said superconductor precursor filaments to oxygen during said heat treating step, said heat treating step resulting in formation of a superconducting magnetic coil.

9. The method of claim 8, wherein said coil forming step comprises the steps of:

concentrically winding said composite layers around a mandrel, forming a multi-layer, insulated "pancake"-shaped coil, each of said layers of said coil being wound to directly overlap the preceding layer to form said "pancake"-shaped coil, said "pancake"-shaped coil permitting exposure of an edge of an entire length of said precursor to said multi-filament composite conductor to a selected oxidizing atmosphere during a heat treating step, said heat treating step resulting in conversion of said superconductor precursor filaments to a desired superconducting material and in repair of micro-cracks formed in said filaments during said forming step.

10. The method of claim 9, wherein each composite layer comprises multiple precursor layers surrounded by a single layer of one of an insulating material and a precursor to an insulating material.

11. The method of claim 9, further comprising the step of winding a second "pancake"-shaped coil on said mandrel adjacent to said "pancake"-shaped coil, forming a double "pancake"-shaped coil.

12. The method of claim 11, wherein said second "pancake"-shaped coil is similar in geometry to said first "pancake"-shaped coil.

13. The method of claim 12 wherein said first and second "pancake"-shaped coils are substantially identical.

14. The method of claim 11, wherein said double "pancake"-shaped coil is formed by the steps of:

winding said precursor to said multi-filament composite conductor around a supply spool, winding a portion of a length of said precursor to said multi-filament composite conductor wound around said supply spool onto a storage spool, concentrically winding a remaining portion of said precursor to said multi-filament composite conductor wound around said supply spool and one of said insulating material and said precursor to said insulating material onto a mandrel to form a composite layer, forming a plurality of said composite layers, each of said composite layers being wound to directly overlap a preceding layer to form a first "pancake"-shaped coil, winding a second "pancake"-shaped coil onto said mandrel using said portion of the length of said precursor to said multi-filament composite conductor wound onto said storage spool and one of an insulating material and a precursor to said insulating material.

15. The method of claim 9, wherein said cross section of said mandrel has an arbitrary shape.

16. The method of claim 9, wherein said cross section of said mandrel is primarily circular in shape.

17. The method of claim 9, wherein said cross section of said mandrel is primarily elliptical in shape.

18. The method of claim 11, further comprising the step of combining multiple double "pancake"-shaped coils.

19. The method of claim 18 further comprising the step of coaxially stacking said multiple double "pancake"-shaped coils.

20. A method for producing a superconducting magnetic coil comprising the steps of:

fabricating a precursor to a multi-filament composite conductor comprising multiple superconductor precursor filaments enclosed in a matrix-forming material, surrounding said precursor to said multi-filament composite conductor with one of an insulating layer and a precursor to an insulating layer, forming said precursor to said multi-filament composite conductor as a coil, and heat treating said coil after said forming step by exposing said coil to high temperatures and an environment comprising oxygen, said superconductor precursor filaments being oxidized and said matrix-forming material reversibly weakening during said heat treating step, the composition and thickness of one of said insulating layer and said precursor to said insulating layer chosen to encase said weakened matrix-forming material and said superconductor precursor filaments and to permit exposure of said superconductor precursor filaments to oxygen during said heat treating step, said heat treating step resulting in formation of a multi-filament composite conductor from said precursor to said multi-filament composite conductor, said multi-filament composite conductor formed into said coil being subjected to a bend strain in excess of the critical strain of said multi-filament composite conductor, said coil, after said heat treating step, having a minimum critical-current of about 1.2 Amperes.

21. The method of claim 20, wherein said forming step comprises the step of subjecting said multi-filament composite conductor to a bend strain in excess of about 0.3%.

* * * * *

UNITED STATES PATENT AND TRADEMARK OFFICE
CERTIFICATE OF CORRECTION

PATENT NO. : 5,531,015

DATED : July 2, 1996

INVENTOR(S) : Michael D. Manlief, Gilbert N. Riley, Jr., John Voccio, Anthony J. Rodenbush It is certified that error appears in the above-identified patent and that said Letters Patent is hereby corrected as shown below:

On the title page: Item [56]

IN OTHER PUBLICATIONS:

Please add the following publication --Gerdel, *"Futuristic tinkering,"* The Plain Dealer, June 18, 1991, Cleveland, OH, pages 1G, 8G.

Column 1, line 33, replace "$Bi_2Sr_2Ca_nCu_nO_{2n+4}$" with --$Bi_2Sr_2Ca_{n-1}Cu_nO_{2n+4}$--.

Column 4, line 21, replace "begin" with --being--.
Column 5, line 57, after "or" add --3;--.
Column 5, line 62, replace "mercury-barium-calcium-coper-oxide" with --mercury-barium-calcium-copper-oxide--.

Column 6, line 44, replace "iS" with --is--; line 46, after "conductors" replace the "," with --.--.
Column 6, line 53, after "device" replace the "," with --.--.
Column 6, line 56, after "invention" replace the "," with --.--.
Column 6, line 64, after "methods" replace the "," with --.--.
Column 7, line 5, after "coil" replace the ";" with --.--.

UNITED STATES PATENT AND TRADEMARK OFFICE

CERTIFICATE OF CORRECTION

PATENT NO. : 5,531,015

DATED : July 2, 1996

INVENTOR(S) : Michael D. Manlief, Gilbert N. Riley, Jr., John Voccio, Anthony J. Rodenbush It is certified that error appears in the above-indentified patent and that said Letters Patent is hereby corrected as shown below:

Column 8, line 8-9, replace "800° K." with --800 K--.

Column 8, line 33-34, replace "20 K." with --20 K-- and replace "90 K.," with --90 K,--.

Column 8, line 58, "Insulation" should be a new and separate paragraph.

Column 10, line 44, replace "an" with --and--.

Column 12, line 17, after "Pending)" insert --.--.

Column 12, line 65, replace "a" with --an--.

Column 13, line 49, after "sag" insert --,--.

Column 14, line 61, replace "11.2x103" with --11.2x10$^3$--.

Column 16, line 25, replace "77 K." with --77 K--.

Column 19, lines 15-16, replace 77 K." with --77 K--.

Column 19, line 62, replace 77 K." with --77 K--.

Claim 6, column 21, line 49, after "material," insert --said precursor to said insulating material,--.

Claim 18, column 23, line 19, replace "11," with --11--.

Signed and Sealed this

Twenty-first Day of July, 1998

Attest:

BRUCE LEHMAN

*Attesting Officer* *Commissioner of Patents and Trademarks*